Figure 1:
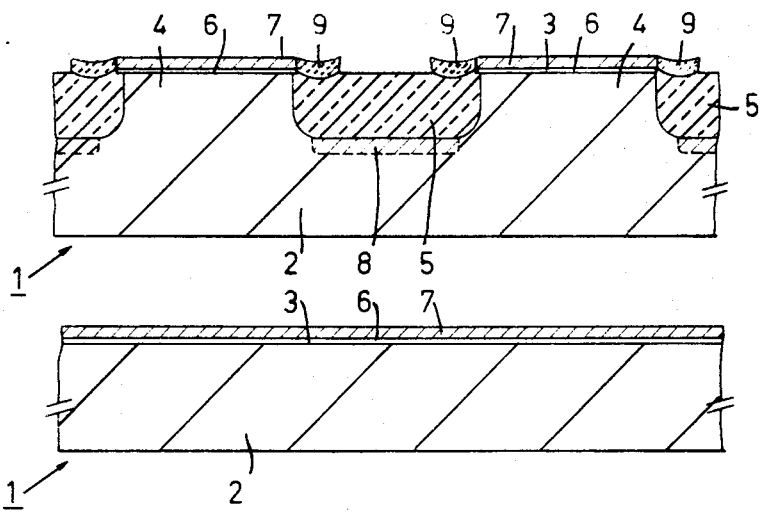
Figure 2:
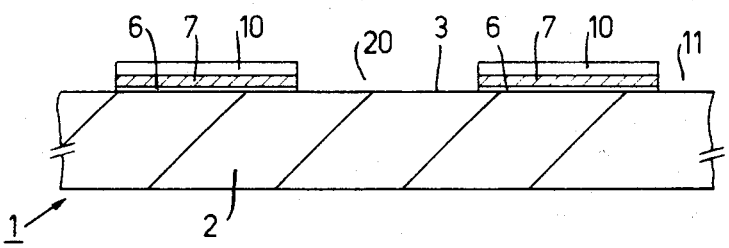
Figure 3:
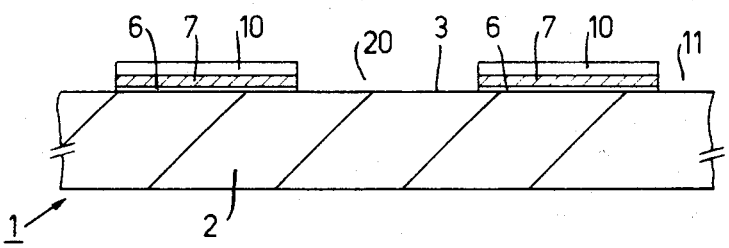
Figure 4:
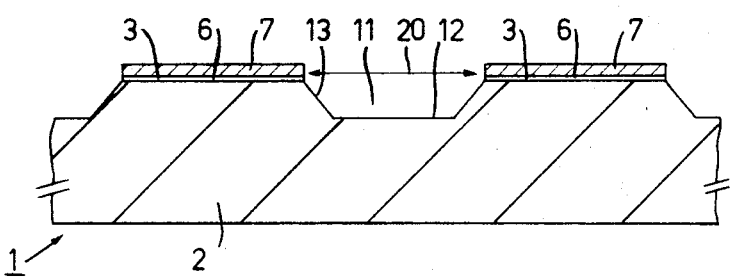
Figure 5:
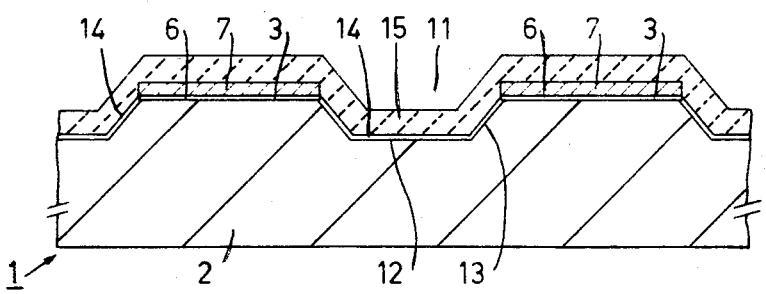

United States Patent [19]

Josquin

[11] Patent Number: 4,533,429

[45] Date of Patent: Aug. 6, 1985

[54] METHOD OF MANUFACTURING A SEMICONDUCTOR DEVICE

[75] Inventor: Wilhelmus J. M. J. Josquin, Eindhoven, Netherlands

[73] Assignee: U.S. Philips Corporation, New York, N.Y.

[21] Appl. No.: 535,124

[22] Filed: Sep. 23, 1983

[30] Foreign Application Priority Data

Oct. 8, 1982 [NL] Netherlands ............... 8203903

[51] Int. Cl.³ .............. H01L 21/306; B44C 1/22; C03C 15/00; C03C 25/06
[52] U.S. Cl. .................. 156/643; 29/576 W; 29/580; 148/1.5; 148/148; 156/647; 156/648; 156/653; 156/657; 156/662; 357/49; 427/93
[58] Field of Search ............... 156/643, 646, 647–649, 156/650–653, 657, 659.1, 661.1, 662; 29/571, 578, 580, 576 W; 148/1.5, 148; 427/93; 357/49

[56] References Cited

U.S. PATENT DOCUMENTS

| | | | |
|---|---|---|---|
| 4,256,514 | 3/1981 | Pogge | 156/657 |
| 4,326,332 | 4/1982 | Kenney | 156/647 X |
| 4,356,211 | 10/1982 | Riseman | 427/93 X |
| 4,398,992 | 8/1983 | Fang et al. | 156/653 X |
| 4,472,240 | 9/1984 | Kameyama | 156/651 X |

Primary Examiner—William A. Powell
Attorney, Agent, or Firm—Paul R. Miller

[57] ABSTRACT

In a LOCOS process, depressions are formed in a semiconductor body, and are filled by means of oxidation. The bottom and side walls of the depressions are coated with a double layer including an oxide and an oxidation-resistant material. This double layer is removed from the bottom of the depression and under-etching below the sidewalls under the oxidation-resistant layer is carried out to form cavities. As a result the remaining portions of the oxidation-resistant material are lifted along the surfaces of the side walls. With oblique walls for the depression, a high accuracy as to the size of active semiconductor regions can then be obtained with respect to an original mask.

9 Claims, 10 Drawing Figures

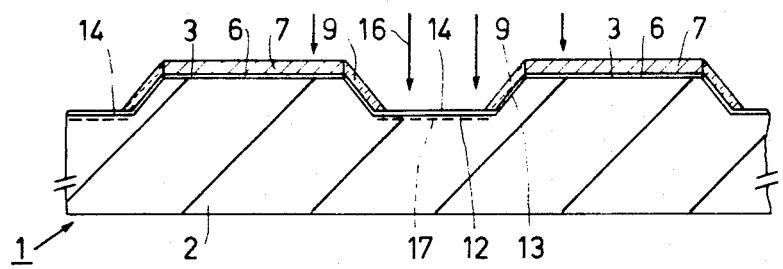
FIG.6
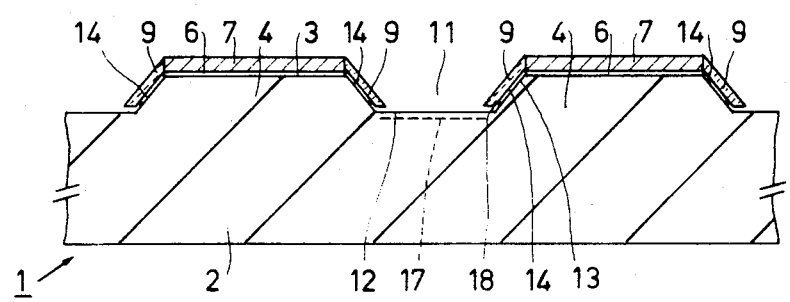
FIG.7
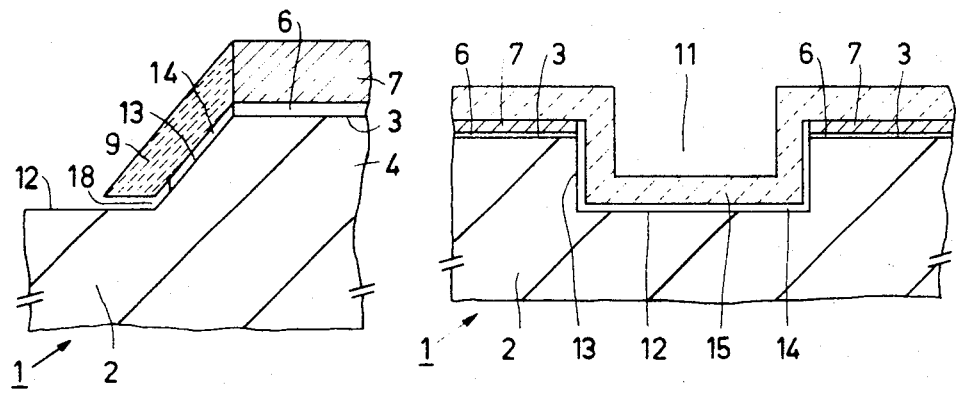
FIG.8
FIG.9
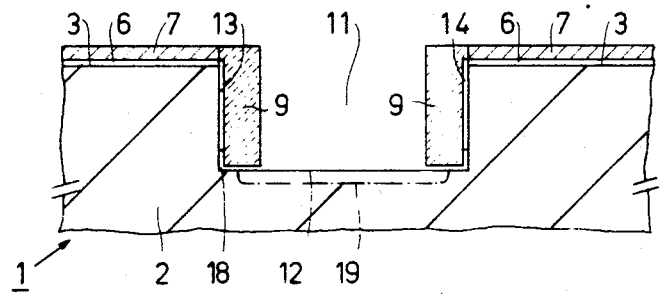
FIG.10

METHOD OF MANUFACTURING A SEMICONDUCTOR DEVICE

The invention relates to a method of manufacturing a semiconductor device comprising mutually dielectrically insulated semiconductor regions, in which the starting material is a semiconductor body having a major surface covered by an etching mask which exposes parts of the major surface, and these parts are subjected to an anisotropic etching treatment, to form a depression by removal of material so that the bottom and side walls of the depression are coated with an oxide layer and a layer of oxidation-resistant material disposed thereon, which layers are then removed from the bottom of the depression, after which the device is subjected to a selective oxidation treatment so that the depression is filled with oxide.

The invention further relates to a semiconductor device manufactured by such a method.

A method of the kind mentioned in the preamble is known from the article "A Bird's Beak Free Local Oxidation Technology Feasible for VLSI Circuits Fabrication" by K. Y. Chiu, J. L. Moll and J. Manoliu, published in "I.E.E.E. Transactions on Electron Devices", Vol. ED.29, No. 4, April 1982, pages 536-540.

In this case, grooves with substantially perpendicular side walls are etched into the exposed semiconductor surface (in this case of silicon). The walls and the bottom of such a groove are coated with an oxide-nitride layer, which is then etched away at the area of the bottom, after which the device is subjected to local oxidation. This results in that the grooves are filled at least in part with oxide, while due to the presence of the nitride on the walls, the effective surface area of the active semiconductor regions is not reduced.

Another method of mutually insulating active semiconductor regions by means of oxide is known from British Patent Specification No. 1,437,112. In this case, the grooves, the walls of which are coated afterwards with nitride, are obtained, however, by means of an isotropic etching treatment, which, due to underetching, results in loss of active semiconductor surface area and hence loss of integration density.

In the method according to the aforementioned article of Chiu et al., such a loss of semiconductor surface area is prevented, it is true, but after the local oxidation the surface obtained is not flat. Therefore, in this case, as an additional step, oxide is deposited at low pressure from the vapour phase in order to fill remaining cavities, after which the oxide is partly etched away again.

In this method, moreover, a problem may arise if so-called channel stopper regions should be provided between the active semiconductor regions. These channel stopper regions are provided, for example, in that, before the oxide-nitride layer is provided, a boron implantation is carried out, in which the first oxidation-resistant mask serves at the same time as an implantation mask. The implanted ions are then present near the bottom of the depression. During the subsequent heat treatment, however, diffusion takes place, as a result of which these channel stopper regions may extend into the active semiconductor region and this may adversely affect the operation of transistors formed therein.

The invention has for its object to provide a method of manufacturing a semiconductor device, which is considerably simplified as compared with that described in the aforementioned article.

It is based on the recognition of the fact that the layer of oxidation-resistant material covering the side walls can be carried upwards together with the oxide growing in the depression by enabling the oxidizing substances to penetrate, though to a small extent, into the layer of thin oxide coated with this oxidation-resistant layer.

A method according to the invention is therefore characterized in that before the oxidation treatment begins, a part of the oxide layer on the walls of the depression below an edge of the layer of oxidation-resistant material near the bottom of the depression is removed by under-etching.

In this manner, due to the fact that the side walls of the depression are coated with an oxidation-resistant material, for example, silicon nitride, these side walls are substantially completely protected from oxidation, while the oxidants can penetrate sufficiently under this oxidation-resistant layer to lift it, as it were, with the growing oxide. On the other hand, the width of the ultimate oxide does not or substantially does not exceed the width of the original depressions so that this width is determined completely by the dimensions of the mask by means of which these depressions are defined.

The depressions in question may have straight walls. These walls are obtained in that the depressions are provided by means of ion etching or plasma etching.

A preferred embodiment of a method according to the invention, which is particularly suitable when channel stoppers have to be provided under the electrically insulating strips, is characterized in that the major surface is a <100> surface. When the semiconductor body is a silicon body and the etchant for the anisotropic etching treatment comprises potassium hydroxide, this etching treatment results in a depression with oblique walls. This has the advantage that an implantation for channel stopper regions can be carried out so that the semiconductor body is doped only at the area of the bottom of the depression. The implanted impurities will then penetrate during a subsequent heat treatment less for into the active semiconductor region and especially will not or substantially not reduce the effective surface area for the formation of circuit elements.

The invention will now be described more fully with reference to a few embodiments and the drawing, in which:

FIG. 1 shows a semiconductor device manufactured by means of a method according to the invention, FIGS. 2 to 7 show the device of FIG. 1 during different stages of its manufacture, and FIG. 8 shows a detail of FIG. 7, while FIGS. 9 and 10 show intermediate stages of another method according to the invention.

The Figures are schematic and not drawn to scale, while and for the sake of clarity in the cross-sections especially the dimensions in the direction of thickness are greatly exaggerated.

Semiconductor zones of the same conductivity type are generally hatched in the same direction; in the various embodiments, corresponding parts are generally designated by the same reference numbers.

The semiconductor device 1 of FIG. 1 comprises a semiconductor body 2, in this example of p-type silicon, with a major surface 3. The semiconductor body 2 is provided at this major surface with active regions 4, which are separated from each other by a dielectric 5, which consists, for example, of a thick layer of silicon oxide. The active regions 4 in FIG. 1 are coated with a double layer 6,7 consisting of a layer 6 of silicon oxide and a layer 7 of silicon nitride. This double layer 6,7 is removed, like the projecting nitride parts 9 located on the thick oxide 5, from the surface 3 before further treatment of the semiconductor body 2. In this manner, the semiconductor device obtains a substantially flat major surface 3, which is favourable for further treatments, such as, for example, the application of a metallization pattern.

The semiconductor device 1 in the present embodiment is moreover provided with channel stoppers 8, which are likewise of the p-type, but have a higher impurity concentration of acceptors than the semiconductor body 2. These channel stoppers 8 serve, for example, to prevent parasitic channel formation between two adjacent active semiconductor regions 4, for example, when these regions comprise n-type MOS field effect transistors, whose source and drain zones directly adjoin the thick oxide 5.

The semiconductor device of FIG. 1 can be manufactured as follows.

The starting material is a semiconductor body 2, for example, a p-type silicon substrate having a resistivity of 5–25Ω.cm and a thickness of 500 μm. A first layer 6 of thin oxide having a thickness of approximately 20 nm is grown by means of thermal oxidation on a major surface 3, which in this embodiment is a <100> surface. Subsequently, a layer 7 of silicon nitride having a thickness of approximately 120 nm is deposited, for example, from the vapour phase at low pressure (LPCVD) on the oxide layer 6, see FIG. 2.

The whole is then coated with a photoresist layer 10, which is patterned photolithographically. While using the pattern as a mask, the nitride layer 7 and the oxide layer 6 are locally removed in a well known manner so that at the area of openings 20 in the photoresist layer 10 the silicon surface 3 is exposed (see FIG. 3).

After the photoresistance layer 10 has been removed, the exposed silicon surface 3 is subjected at the area of the openings 20, while using the double layer 6,7 as a mask, to a wet chemical anisotropic etching treatment. The etching treatment is carried out, for example, with a 20% solution of potassium hydroxide in water. This anisotropic etching treatment is effected so that in the depressions 11 then obtained, <111> facets are exposed along the walls 13, viewed in cross-section (see FIG. 4), the bottom 12 of such a depression 11 being narrower than the openings 20 in the original photoresistance layer 10. The advantages thereof will be disclosed more fully hereinafter.

The etching treatment is effected down to a depth of approximately 0.65 μm. Subsequently, in a well known manner, a layer 14 of silicon oxide of approximately 40 nm is grown on the bottom 12 and the walls 13 of the depression 11, after which a layer 15 of silicon nitride of approximately 200 nm is provided on the entire surface (see FIG. 5).

The layer 15 of silicon nitride is then removed for the major part by means of an anisotropic etching treatment, for example, by bringing the layer into contact with constituents of a plasma formed in a gas mixture comprising chlorine or carbon tetrachloride. The results of the anisotropic etching treatment (plasma etching or ion etching) is that parts of the layer 15, which cover the bottom 12 of the depression 11 or the major surface, are completely removed, while due to the larger effective thickness parts 9 of the nitride layer 15 are left on the side walls 13 of the depression 11.

After this etching treatment the device is subjected in this embodiment to an implantation with boron ions, which is indicated schematically in FIG. 6 by the arrows 16. This implantation is carried out with such an energy that the impurities 17 on the bottom 12 of the depression 11 penetrate through the oxide 14 into the semiconductor body, whereas everywhere at the remaining areas the nitride parts 9 and the double layer 6,7 act as a mask. In a next step, the oxide layer 14 is removed by etching in a buffered HF solution. Of course, this etching step may also be carried out before the implantation step of FIG. 6. Thus, the structure of FIG. 7 is obtained.

According to the invention, the etching treatment for removing the thin oxide layer 14 is carried out so that due to under-etching over a distance of approximately 300 nm a part of the oxide is etched away under the nitride parts 9 so that at the bottom 12 of the depression 11 a cavity 18 is formed under the nitride. In order to illustrate this, a part of FIG. 7 is shown in FIG. 8 on an enlarged scale.

Subsequently, the device of FIG. 7 is subjected to a local oxidation treatment. The double layer 6,7 of oxide and nitride then acts as an oxidation-resistant mask on the major surface 3, while the double layer 14,9 of oxide and nitride on the walls 13 of the depression 11 fulfils the same function. However, due to the fact that the oxidizing medium (for example, a mixture of water and oxygen) nevertheless can penetrate slightly through the cavity 18 into the thin oxide 14, the nitride parts 9 are lifted upwards as it were during the oxidation treatment. At the same time, the walls 13 are subjected to oxidation, but to such an extent that with a suitable choice of the thickness of the oxide layer 14 (for example, between 20 and 200 nm) and of the degree of under-etching (between 0.2 and 1.5 μm) with a certain depth of the depression 11 a final structure is obtained as shown in FIG. 1, in which at the major surface 3 the dimensions of the active semiconductor regions 4 are solely determined by those of the mask by means of which the openings 20 in the photoresistance layer 10 were defined. The double layer 6,7 and the nitride parts 9 in the device of FIG. 1 can be removed in known manner before other process steps, such as implantations, diffusions, etc., are carried out.

In a modification of a method according to the invention, the depression 11 is provided by means of plasma etching or ion etching with walls 13 at right angles to the bottom 12. After the depression 11 has been formed, the whole is coated again with a thin layer 14 of silicon oxide and a layer 15 of silicon nitride (see FIG. 9). After the nitride layer 15 has been removed again for the major part, except the nitride parts 9 on the walls 13, the thin oxide 14 is etched away so that at the area of the bottom 12 of the depression 11 cavities 18 are formed again, which render the thin oxide 14 accessible for the oxidizing medium. If required, before the oxidation treatment, the bottom 12 may be subjected to a further light etching treatment so that the oxidizing substances can penetrate more readily into the cavities 18; this is indicated diagrammatically in FIG. 10 with the aid of the dot-and-dash line 19. Otherwise, the reference numerals again have the same meaning as in the other Figures.

It is a matter of course that the invention is not limited to the aforementioned embodiments, but that various modifications are possible within the scope of the invention.

For example, the ion implantation as shown in FIG. 6 is not always necessary. Further, as already stated, this implantation may be carried out, if desired, after the thin oxide 14 has been removed or immediately after the depression has been etched, for example, in order to obtain with MOS transistors a uniform threshold voltage. Moreover, a choice may be made from various other semiconductor materials and etchants, etc.

What is claimed is:

1. A method of manufacturing a semiconductor device comprising mutually dielectrically insulated semiconductor regions, in which the starting material is a semiconductor body having a major surface covered by an etching mask which exposes parts of the major surface, and said parts are subjected to an anisotropic etching treatment to form a depression by removal of material, the bottom and side walls of said depression being coated with an oxide layer and a layer of oxidation-resistant material disposed thereon, which layers are then removed from the bottom of the depression, after which the device is subjected to a selective oxidation treatment so that the depression is filled with oxide, characterized in that, before said selective oxidation treatment begins, a part of the oxide layer on the side walls of the depression under an edge of the layer of oxidation-resistant material near the bottom of the depression is removed by under-etching.

2. A method as claimed in claim 1, characterized in that the oxide layer has a thickness between 20 and 200 nm.

3. A method as claimed in claim 1 or 2, characterized in that the oxide layer is underetched over a distance of at least 200 nm and at most 1.5 μm.

4. A method as claimed in claim 1, characterized in that the major surface is a <100> surface.

5. A method as claimed in claim 1, characterized in that the semiconductor body consists of silicon and the etchant for the anisotropic etching treatment comprises potassium hydroxide.

6. A method as claimed in claim 1, characterized in that the oxidation-resistant layer is removed from the bottom by bringing this layer into contact with constituents of a plasma.

7. A method as claimed in claim 1, characterized in that, after the oxidation-resistant layer has been removed from the depression, before the device is subjected to the selective oxidation treatment, the depression is further deepened by a second removal of material.

8. A method as claimed in claim 7, characterized in that the second removal of material is carried out by bringing the material to be removed into contact with constituents of a plasma.

9. A method as claimed in claim 1, characterized in that the semiconductor body is provided at the area of the bottom of the depression with impurities by means of an ion implantation.

* * * * *